(12) United States Patent
Kang

(10) Patent No.: US 9,065,053 B2
(45) Date of Patent: Jun. 23, 2015

(54) DONER SUBSTRATES AND METHODS OF MANUFACTURING ORGANIC LIGHT EMITTING DISPLAY DEVICES USING DONOR SUBSTRATES

(71) Applicant: Samsung Display Co., Ltd., Yongin, Gyeonggi-Do (KR)

(72) Inventor: Ji-Hyun Kang, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/952,375

(22) Filed: Jul. 26, 2013

(65) Prior Publication Data

US 2014/0038349 A1 Feb. 6, 2014

(30) Foreign Application Priority Data

Jul. 27, 2012 (KR) .................... 10-2012-0082223

(51) Int. Cl.
| | | |
|---|---|---|
| H01L 21/00 | (2006.01) |
| H01L 51/00 | (2006.01) |
| C09J 7/02 | (2006.01) |
| H01L 27/32 | (2006.01) |
| H01L 51/52 | (2006.01) |
| B41M 5/42 | (2006.01) |
| H01L 51/56 | (2006.01) |

(52) U.S. Cl.
CPC ........... *H01L 51/0013* (2013.01); *C09J 7/0203* (2013.01); *Y10T 428/24793* (2015.01); *H01L 27/3283* (2013.01); *H01L 27/3246* (2013.01); *H01L 51/5203* (2013.01); *B41M 5/42* (2013.01); *B41M 2205/30* (2013.01); *H01L 51/56* (2013.01); *Y02E 10/549* (2013.01)

(58) Field of Classification Search
CPC . H01L 51/5203; H01L 51/0013; H01L 51/56; H01L 27/3246; H01L 27/3283
USPC ........................ 438/99, 34, 22; 257/E51.022
See application file for complete search history.

(56) References Cited

U.S. PATENT DOCUMENTS

| 8,815,352 B2 * | 8/2014 | Aoyama et al. ............... 427/557 |
| 2011/0273077 A1 * | 11/2011 | Chen et al. ..................... 313/483 |
| 2012/0025182 A1 * | 2/2012 | Umeda et al. .................... 257/40 |
| 2012/0086330 A1 * | 4/2012 | Umeda et al. ................. 313/504 |
| 2014/0326399 A1 * | 11/2014 | Kang ............................. 156/237 |

FOREIGN PATENT DOCUMENTS

| KR | 1020060017414 A | 2/2006 |
| KR | 1020060018158 A | 2/2006 |
| KR | 1020060020049 A | 3/2006 |
| KR | 1020080065839 A | 7/2008 |

* cited by examiner

*Primary Examiner* — Michael Trinh
(74) *Attorney, Agent, or Firm* — Robert E. Bushnell, Esq.

(57) ABSTRACT

A donor substrate may include a base layer, a light to heat conversion layer disposed on the base layer, a buffer layer disposed on the light to heat conversion layer, an organic transfer layer disposed on the buffer layer, and a tightening member disposed on a peripheral portion of the organic transfer layer. The tightening member may include an adhesive film having an adhesion strength controlled by an irradiation of an ultraviolet ray. Process failures for manufacturing an organic light emitting display device may be prevented by the donor substrate, so that the organic light emitting display device may ensure improved performances.

7 Claims, 4 Drawing Sheets

DONER SUBSTRATES AND METHODS OF MANUFACTURING ORGANIC LIGHT EMITTING DISPLAY DEVICES USING DONOR SUBSTRATES

CLAIM OF PRIORITY

This application claims priority under 35 U.S.C. §119 to Korean patent Application No. 10-2012-0082223 filed on Jul. 27, 2012, the disclosure of which is hereby incorporated by reference herein in its entirety.

BACKGROUND OF THE INVENTION

1. Field of the Invention

Example embodiments of the invention relate to donor substrates, methods of manufacturing organic light emitting display (OLED) devices using donor substrates. More particularly, example embodiments of the invention relate to donor substrates having tightening members relative to display substrates, and method of manufacturing organic light emitting display devices using the donor substrates having the tightening members.

2. Description of the Related Art

An organic light emitting display (OLED) device usually includes various organic layers such as an organic light emitting layer, a hole injection layer, an electron transfer layer, etc. Recently, a laser induced thermal imaging (LITI) process has been developed to form the organic layers of the organic light emitting display device.

In the conventional laser induced thermal imaging process, a donor substrate including organic materials transferred onto a display substrate is placed on the display substrate in an atmosphere, and then the donor substrate is irradiated with a laser to transfer the organic materials onto the display substrate, thereby forming organic layers on the display substrate. However, an air or a gas may be trapped between the donor substrate and the display substrate having a pixel defining layer, while the laser is applied onto the donor substrate after the donor substrate is attached to the display substrate having the pixel defining layer. The trapped air or gas may oxidize and/or may contaminate the organic layers on the display substrate, and thus the organic light emitting display device may easily deteriorates and may have a lower quality of image.

Considering the above-mentioned problems, Korean Patent Application Publication No. 2005-0068777 (entitled "laser induced thermal imaging method for manufacturing an organic light emitting display device") discloses that a donor substrate is laminated with a display substrate by interposing an adhesive means such as tape or an adhesive film between the donor substrate and the display substrate, and then a laser induced thermal imaging process is performed on the donor substrate. However, in this method of laminating the donor substrate with the display substrate using the adhesive means, small particles and bubbles remaining on a surface of the adhesive means composed of polymer may not completely removed, and may be outgaseed from an organic layer formed on the display substrate after cleaning the display substrate. Accordingly, defects caused by the particles and the bubbles may be generated between the adhesive means and the display substrate and/or the donor substrate. An air may be easily introduced between the display substrate and the donor substrate when such defects occur, and thus a vacuum state between the display substrate and the donor substrate may not be maintained. This may result in damage or deterioration of the organic layers formed on the display substrate.

Meanwhile, an adhesion state between the donor substrate and the display substrate may be reduced because the adhesive means has a relatively larger thickness, so that the organic transfer layer of the donor substrate may not properly transferred onto the display substrate. Additionally, the donor substrate or the display substrate may be distorted or transformed at high temperature while the donor substrate is attached to the display substrate by a thermal pressing process using the adhesive means. Furthermore, severe defects such as particles, remaining adhesive components or static electricity may be generated on the display substrate after a peeling process for detaching the donor substrate from the display substrate. Therefore, failures caused by the defects in manufacturing processes and also an organic light emitting display device may have poor performances.

SUMMARY OF THE INVENTION

Example embodiments provide donor substrates having tightening members for forming organic light emitting structures on display substrates of organic light emitting display devices without process failures while maintaining vacuum conditions between the donor substrate and the display substrates.

Example embodiments provide method of manufacturing organic light emitting display devices using donor substrates having tightening members without process failures.

According to one aspect of the invention, there is provided a donor substrate including a base layer, a light to heat conversion layer, an organic transfer layer, a tightening member, etc. The light to heat conversion layer may be disposed on the base layer, and the organic transfer layer may be positioned on the light to heat conversion layer. The tightening member may be located on a peripheral portion of the organic transfer layer. The tightening member may include an adhesive film and an adhesion strength of the adhesive film being changed when exposed to an ultraviolet (UV) ray.

In example embodiments, the tightening member may have a substantially rectangular ring shape, a substantially rectangular frame shape, a substantially circular ring shape, a substantially elliptical ring shape, a substantially polygonal ring shape, etc.

In example embodiments, the tightening member may have a horizontal width and a longitudinal width substantially the same as a horizontal width and a longitudinal width of the organic transfer layer, respectively.

In example embodiments, both surfaces of the adhesive film of the tightening member may have adhesion strengths.

In some example embodiments, one surface of the adhesive film of the tightening member may have an adhesion strength. The tightening member may have an inner horizontal width and an inner longitudinal width substantially the same as a horizontal width and a longitudinal width of a display substrate, respectively, on which the donor substrate is attached. The tightening member may be substantially greater than those of the display substrate. An inner surface of the adhesive film of the tightening member contacting the display substrate may have an adhesion strength.

In example embodiments, the adhesive film of the tightening member may include acryl-based polymer having an adhesion strength which may be decreased when exposed to the ultraviolet ray. For example, the adhesive film of the tightening member may include oligourethan acrylate, ester acrylate, etc.

In example embodiments, the tightening member may include a base film disposed between the organic transfer layer and the adhesive film. The base film may include an ultraviolet ray transmittable film. For example, the base film may include polyethyleneterephthalate (PET), polyethylenenaphthalate (PEN), polyolefin, etc.

According to one aspect of the invention, there is provided a method of manufacturing an organic light emitting display device. In the method, a display substrate including a switching device, a first electrode and a pixel defining layer may be formed. A donor substrate may be formed. The donor substrate may include a base layer, a light to heat conversion layer formed on the base layer, an organic transfer layer formed on the light to heat conversion layer, and a tightening member having an adhesive film and disposed on a peripheral portion of the organic transfer layer. An adhesion strength of the adhesive film can be changed when exposed to an ultraviolet (UV) ray. The donor substrate may be combined with the display substrate with the tightening member interposed between the donor and the display substrates. The donor substrate may be irradiated with a laser beam to form an organic light emitting structure on the first electrode in a display region of the display substrate from the organic transfer layer of the donor substrate. The tightening member may be irradiated with an ultraviolet ray, and the donor substrate may be separated from the display substrate.

In example embodiments, the tightening member may be selectively irradiated with an ultraviolet ray to separate the donor substrate from the display substrate.

According to example embodiments of the invention, a donor substrate may include a tightening member which may have a relatively large adhesion strength before an ultraviolet ray is irradiated thereto whereas may have a relatively small adhesion strength after the ultraviolet ray is irradiated thereto. The donor substrate may be combined with a display substrate while the tightening member is interposed between the donor substrate and the display substrate. An air may not be trapped or remained between the donor substrate and the display substrate, so that a substantial vacuum state may be maintained between the donor and the display substrates in a laser induced thermal imaging process. Thus, an organic light emitting structure may be uniformly formed on the display substrate from an organic transfer layer of the donor substrate without any damage or deterioration of the organic light emitting structure. Additionally, an ultraviolet ray may be selectively applied onto the tightening member along a peripheral portion of the donor substrate to considerably reduce the adhesion strength of the tightening member, such that particles, impurities and/or bubbles may not remain on the organic light emitting structure or a pixel defining layer of the display substrate after separating the donor substrate from the display substrate. As a result, an organic light emitting display device may ensure improved performances while reducing failures caused by the particles, the impurities and/or the bubbles in manufacturing processes.

BRIEF DESCRIPTION OF THE DRAWINGS

Example embodiments can be understood in more detail from the following description taken in conjunction with the accompanying drawings, in which.

DESCRIPTION OF THE INVENTION

Figure 1:
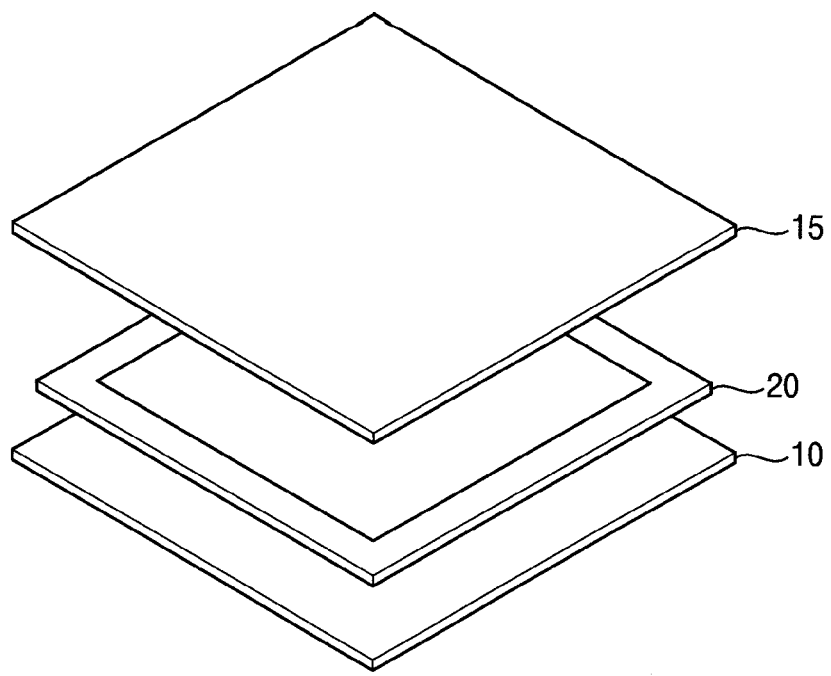
FIG. 1 is a perspective view illustrating a donor substrate and a display substrate in accordance with example embodiments.

The example embodiments are described more fully hereinafter with reference to the accompanying drawings. The invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the invention. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a perspective view illustrating a donor substrate and a display substrate in accordance with example embodiments.

Referring to FIG. 1, a donor substrate 15 according to example embodiments may include a tightening member 20 being capable of tightly attached to a display substrate 10. Here, the donor substrate 15 may have dimensions substantially the same as or substantially similar to those of the display device 10. Additionally, the tightening member 20 may have a horizontal width and a vertical width substantially the same as or substantially similar to those of the donor substrate 15 and/or those of the display substrate 10. Although it is not illustrated, a switching device, a pixel electrode, a common electrode, a pixel defining layer and an organic light emitting structure may be provided on the display substrate 10.

In example embodiments, the donor substrate 15 may include a base layer, a light to heat conversion layer, a buffer layer, an organic transfer layer, etc. The base layer may support the light to heat conversion layer, the buffer layer and the organic transfer layer. For example, the base layer may include polyethylene, polystyrene, polyethylene terephthalate, polyester, polyacryl, polyepoxy, etc.

The light to heat conversion layer may be disposed on the base layer, and may include a light absorption material for converting the energy of the laser beam, which may be applied onto the donor substrate 100, into a thermal energy. A buffer layer may be disposed on the light to heat conversion layer, and an organic transfer layer may be disposed on the buffer layer. The thermal energy generated by the laser beam may reduce the adhesion strength between the organic transfer layer and the buffer layer, so that the organic transfer layer may be transferred onto a display region of the display substrate 10. For example, the light to heat conversion layer may include aluminum (Al), molybdenum (Mo), aluminum oxide (AlOx), molybdenum oxide (MoOx), aluminum sulfide (AlSx), molybdenum sulfide (MoSx), etc. In some example embodiments, the light to heat conversion layer may include an organic material to which carbon black, graphite and/or infrared ray dye may be added. In other example embodiments, the light to heat conversion layer may additionally include a gas generation material such as tetrabitropentaerythrite (PETN), trinitrotoluene (TNT), etc. Such a gas generating material may generate a nitrogen gas or a hydrogen gas after the gas generating material may be decomposed by absorbing light or heat, to thereby provide the energy for transferring the organic transfer layer onto the display substrate 10.

The buffer layer may be interposed between the light to heat conversion layer and the organic transfer layer. The buffer layer may block the diffusion of gas and/or particles generated from the light to heat conversion layer into the organic transfer layer. Thus, the buffer layer may prevent the deterioration of the physical and chemical characteristics organic transfer layer. For example, the buffer layer may include polyimide, polyester, polycarbonate, polyacryl, polyepoxy, polyethylene, polystyrene, polyethylene terephthalate, etc.

The organic transfer layer may be positioned on the buffer layer. An organic light emitting structure of the display substrate 10 may be obtained from the organic transfer layer. In example embodiments, the organic transfer layer may have a multi layer structure, which may include an organic light emitting layer, a hole injection layer, a hole transfer layer, an electron transfer layer, an electron injection layer, etc.

Referring now to FIG. 1, the tightening member 20 may be disposed on the organic transfer layer. In example embodiments, the tightening member 20 may include an adhesive film that may have an adhesion strength adjusted by an application of a light such as an ultraviolet (UV) ray. For example, the tightening member 20 may include an ultraviolet ray curable film. Here, the ultraviolet ray curable film may include an acryl-based polymer such as oligourethan acrylate, ester acrylate, etc.

In example embodiments, the tightening member 20 may be located between a peripheral portion of the display substrate 10 and a peripheral portion of the organic transfer layer. For example, the tightening member 20 may have a substantially rectangular ring shape or a substantially rectangular frame shape with an opening exposing a portion of the display substrate or the organic transfer layer. However, the shape of the tightening member 20 may vary in accordance with a shape of the display substrate 10 and/or a shape of the donor substrate 15. For example, the tightening member 20 may also have a substantially circular ring shape, a substantially elliptical ring shape, a substantially track ring shape, a substantially polygonal ring shape, etc.

In example embodiments, the tightening member 20 may have a first surface and a second surface, both of which may have adhesion strengths, respectively. Here, the first surface of the tightening member 20 may contact the organic transfer layer, and the second surface of the tightening member 20 may make contact with the display substrate 10. The first and the second surfaces of the tightening member 20 may have relatively high adhesion strengths before the ultraviolet ray is applied onto the tightening member 20. Thus, the tightening member 20 may strongly combine the donor substrate 15 with the display substrate 10. Such a combining process for the donor substrate 15 and the display substrate 10 using the tightening member 20 may be carried out in a substantial vacuum condition. When the donor substrate 15 is attached to the display substrate 10 under the vacuum condition, substantially no air may be trapped between the display substrate 10 and the donor substrate 15. Therefore, the organic transfer layer of the donor substrate 15 may be exactly transferred onto the display substrate 10 by a laser induced thermal imaging (LITI) process. Further, defects such as particles or bubbles may not generated between the peripheral portion of the display substrate 10 and the donor substrate 15, so that a vacuum state between the display substrate 10 and the donor substrate 15 may be substantially uniformly maintained. As a result, the organic light emitting structure in the display region of the display substrate 10 may not deteriorate or may not be damaged after the laser induced thermal imaging process. Furthermore, as described below, an ultraviolet ray may be selectively applied onto the tightening member 20 through the peripheral portion of the donor substrate 15, such that the adhesion strength of the tightening member 20 may be decreased. Therefore, the donor substrate 15 having the tightening member 20 may be completely separated from the display substrate 10 after the laser induced thermal imaging process without causing the damage to the organic light emitting structure and remaining particles on the display substrate 10.

In some example embodiments, the tightening member 20 may have a configuration in which an adhesive film may be attached to a base film. In this case, the base film may have a relatively large thickness in a range of about 50 μm to about 100 μm, and the adhesive film may have a relatively small thickness of about 5 μm to about 15 μm. The tightening member 20 including the base film and the adhesive film may also have a substantially rectangular shape or a substantially rectangular frame shape as described with reference to FIG. 1. However, the tightening member 20 including the base and the adhesive films may also have various shapes in accordance with the shape of the display substrate 10 and/or the shape of the donor substrate 15. The base film may include an ultraviolet ray transmittable film. For example, the base film may include polyethyleneterephthalate (PET), polyethylenenaphthalate (PEN), polyolefin, etc. In other example embodiments, the tightening member 20 may include a base film, an adhesive film and a protection film. Here, the protection film may have a thickness in a range of about 30 μm to about 50 μm. The protection film may be removed when the donor substrate 15 is attached to the display substrate 10 by interposing the tightening member 20 therebetween. For example, the protection film may include polyimide, polyester, polycarbonate, polyacryl, polyepoxy, polyethylene, polystyrene, polyethyleneterephthalate, etc.

In example embodiments according to the invention, the donor substrate 15 may include the tightening member 20 having the adhesive film, and the donor substrate 15 may be combined with the display substrate 10 under the substantial vacuum condition. Thus, the air may not be remained or trapped between the display substrate 10 and the donor substrate 15, and the vacuum state between the display and the donor substrates 10 and 15 may be uniformly maintained in the laser induced thermal imaging process for forming the organic light emitting structure on the display substrate 10. As a result, the organic light emitting structure may be uniformly and stably formed in the display region of the display substrate 10 from the organic transfer layer of the donor substrate 15, and also the deterioration and/or the damage of the organic light emitting structure caused by the air may be effectively prevented.

Figure 2:
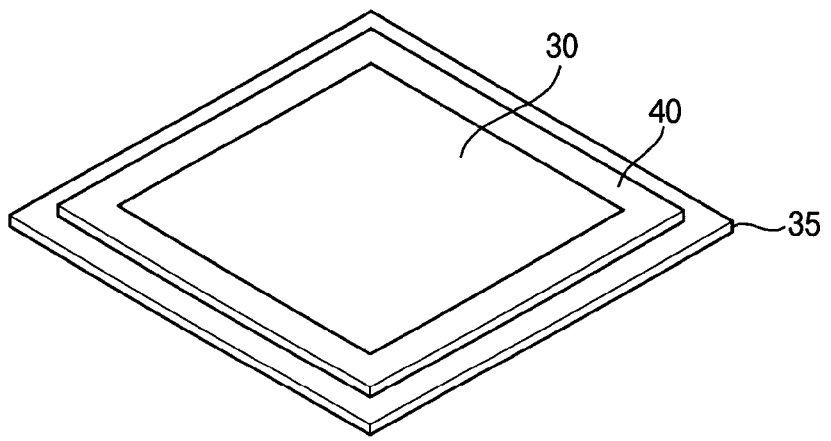
FIG. 2 is a perspective view illustrating a donor substrate and a display substrate in accordance with some example embodiments.

FIG. 2 is a perspective view illustrating a donor substrate and a display substrate in accordance with some example embodiments. The donor substrate illustrated in FIG. 2 may have a configuration substantially the same as or substantially similar to that of the donor substrate 15 described with reference to FIG. 1.

Referring to FIG. 2, a donor substrate 35 may include a base layer 41, a light to heat conversion layer formed on the base layer 41, a buffer layer formed on the light to heat conversion layer, an organic transfer layer formed on the buffer layer, a tightening member 40 formed on the organic transfer layer, etc. In example embodiments, the layers of the donor substrate 35 may have dimensions substantially larger than the layers of a display substrate 30 except for the tightening member 40.

The tightening member 40 may be positioned on the organic transfer layer. In example embodiments, the tightening member 40 may have dimensions substantially smaller than those of the organic transfer layer. For example, the tightening member 40 may be located on a peripheral portion of the organic transfer layer, and the display substrate 30 may be disposed on a central portion of the organic transfer layer. In this case, the tightening member 40 may substantially surround the display substrate 30. For example, four edge sides of the display substrate 30 may strongly contact four inner edge sides of the tightening member 40. In other words, the display substrate 30 may have a horizontal width and a longitudinal width substantially the same as or substantially similar to an inner horizontal width and an inner longitudinal width of the tightening member 40. Such tightening member 40 may have a substantially rectangular ring shape or a substantially rectangular frame shape. However, the shape of the tightening member 40 may vary in accordance with the shape of the display substrate 30 provided on the tightening member 40.

In example embodiments, the tightening member 40 may include an adhesive film which may include a surface contacting the organic transfer layer and an inner surface contacting the display substrate 30. Here, both of the surface and the inner surface of the adhesive film may have adhesion strengths. However, the adhesive film may include another surface having no adhesion strength substantially opposed to contacting the organic transfer layer. For example, the adhesive film may include an ultraviolet ray curable film including acryl-based polymer such as olygourethan acrylate or ester acrylate. In some example embodiments, the tightening member 40 may additionally include a base film disposed on the adhesive film. The base film may include an ultraviolet ray transmittable polymer. When the tightening member 40 includes the base film, both surfaces of the adhesive film may have adhesion strengths, respectively.

The donor substrate 35 having the tightening member 40 may be combined with the display substrate 30 under a substantially vacuum condition. That is, the display substrate 30 may be inserted into the tightening member 40 of the donor substrate 35 under the substantially vacuum condition, such that a substantial vacuum state may be maintained between the display substrate 30 and the donor substrate 35 without trapping or remaining an air therebetween. Therefore, an organic light emitting structure may be uniformly formed on the display substrate 30 from the organic transfer layer of the donor substrate 35. After forming the organic light emitting structure on the display substrate 30 by a laser induced thermal imaging process, a VU ray may be irradiated onto an adhesion line between the display substrate 30 and the tightening member 40. Therefore, the adhesion strength of the tightening member 40 may be reduced to thereby easily separating the donor substrate 35 having the tightening member 40 from the display substrate 30. In this case, the tightening member 40 is not positioned on the display substrate 30 in the laser induced thermal imaging process, so that remaining impurities on the display substrate 30 or generation of bubbles may be more effectively prevented.

Figure 3:
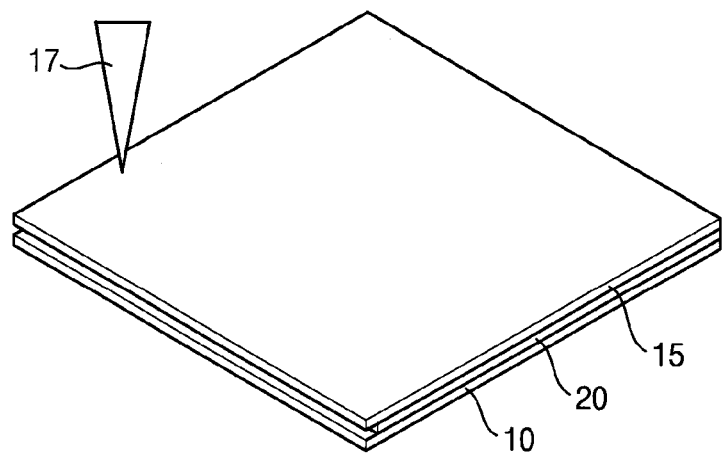
FIGS. 3 and 4 are perspective views illustrating a process of separating a donor substrate from a display substrate in accordance with example embodiments.
Figure 4:
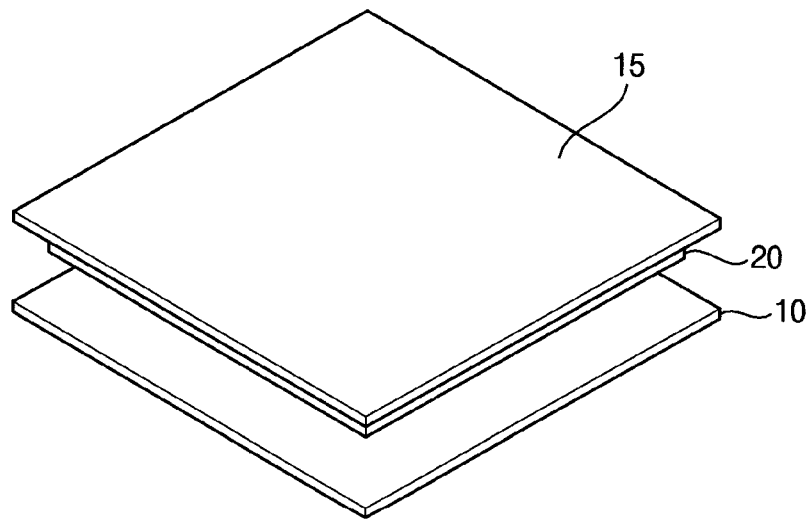

FIGS. 3 and 4 are perspective views illustrating a method of separating a donor substrate having a tightening member from a display substrate in accordance with example embodiments. In FIGS. 3 and 4, the donor substrate and the display substrate may have configurations substantially the same as or substantially similar to the donor substrate 15 and the display substrate 10 described with reference to FIG. 1. However, the donor substrate and the display substrate in FIGS. 3 and 4 may have configurations substantially the same as or substantially similar to the donor substrate 35 and the display substrate 40 described with reference to FIG. 2.

As illustrated in FIG. 3, a laser induced thermal imaging process may be performed to form an organic light emitting structure on the display substrate 10 from an organic transfer layer of the donor substrate 15, and then an ultraviolet ray 17 may be applied onto a peripheral portion of the donor substrate 15. Since a tightening member 20 may be positioned on the peripheral portion of the donor substrate 15 and a peripheral portion of the display substrate 10, the adhesion strength of the tightening member 20 may be decreased by the irradiation of the ultraviolet ray 17. For example, the adhesion strength of the tightening member 20 may be reduced in a relatively large range from about 200 gf/25 mm to about 1,000 gf/25 mm to a relatively small range of about 10 gf/25 mm to about 20 gf/25 mm. Accordingly, as shown in FIG. 4, the donor substrate 15 having the tightening member 20 may be easily separated from the display substrate 10. The donor substrate 15 may be easily detached from the display substrate 10 in accordance with the reduction of the adhesion strength of the tightening member 20, so that the organic light emitting structure may not be damaged or deteriorated while separating the donor substrate 15 from the display substrate 10. Further, no particles, impurities and/or bubbles may remain on the display substrate 10 after the separation of the donor substrate 15.

FIGS. 5 to 8 are cross-sectional views illustrating a method of manufacturing an organic light emitting display device using a donor substrate in accordance with example embodiments. In the method illustrated in FIGS. 5 to 8, the organic light emitting display device may be manufactured using a donor substrate 160 having a configuration substantially the same as or substantially similar to that of the donor substrate 15 described with reference to FIG. 1. However, the organic light emitting display device may be obtained using other donor substrate having a configuration substantially the same as or substantially similar to that of the donor substrate 35 having the tightening member 40.

Figure 5:
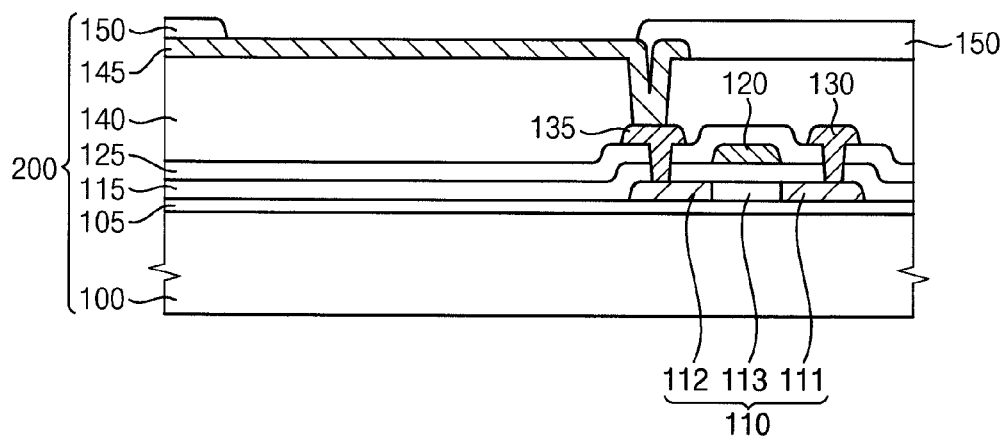
FIGS. 5 to 8 are cross-sectional views illustrating a method of manufacturing an organic light emitting display device using a donor substrate in accordance with example embodiments.

Referring to FIG. 5, a buffer layer 105 may be formed on a first substrate 100. The first substrate 100 may include a transparent insulation substrate. For example, the first substrate 100 may include a glass substrate, a quartz substrate, a transparent resin substrate, etc. Here, the transparent resin substrate may include polyimide-based resin, acryl-based resin, polyarylate-based resin, polycarbonate-based resin, polyether-based resin, polyethylene terephthalate-based resin, etc.

The buffer layer 105 may prevent metal atoms and/or impurities from being diffused from the first substrate 100. The buffer layer 105 may adjust a heat transfer rate in a successive crystallization process for an active pattern 110, so that the active pattern 110 may have substantially uniform properties. Additionally, the buffer layer 105 may improve the surface flatness of the first substrate 100 when the first substrate 100 may have an irregular surface.

The buffer layer 105 may be formed using a silicon compound. For example, the buffer layer 105 may include silicon oxide ($SiO_x$), silicon nitride ($SiN_x$), silicon oxynitride ($SiO_xN_y$), silicon oxycarbide ($SiO_xC_y$, silicon carbon nitride ($SiC_xN_y$), etc. These may be used alone or in a combination thereof. The buffer layer 105 may be formed on the first substrate 100 by a spin coating process, a chemical vapor deposition (CVD) process, a plasma enhanced chemical vapor deposition (PECVD) process, a high density plasma-chemical vapor deposition (HDP-CVD) process, a printing process, etc. The buffer layer 105 may have a single layer structure or a multi layer structure. For example, the buffer layer 105 may include a silicon oxide film, a silicon nitride film, a silicon oxynitride film, a silicon oxycarbide film and/or a silicon carbon nitride film.

The active pattern 110 may be formed on the buffer layer 105. In example embodiments, a semiconductor layer (not illustrated) may be formed on the buffer layer 105, and then the semiconductor layer may be patterned to form a preliminary semiconductor pattern (not illustrated) may be formed on the buffer layer 105. The crystallization process may be performed on the preliminary semiconductor pattern, so that the active pattern 110 may be obtained. In this case, the semiconductor layer may be formed by a chemical vapor deposition process, a plasma enhanced chemical vapor deposition process, a low pressure chemical vapor deposition (LPCVD) process, a sputtering process, etc. The crystallization process for forming the active pattern 110 may include a laser irradiation process, a thermal treatment process, a thermal process using a catalyst, etc. When the semiconductor layer includes amorphous silicon, the active pattern 110 may include polysilicon.

Referring now to FIG. 5, a gate insulation layer 115 may be formed on the buffer layer 105 to substantially cover the active pattern 110. The gate insulation layer 115 may be obtained by a chemical vapor deposition process, a spin coating process, a plasma enhanced chemical vapor deposition process, a sputtering process, a vacuum evaporation process, a high density plasma-chemical vapor deposition process, a printing process, etc. Further, the gate insulation layer 115 may be formed using silicon oxide and/or metal oxide. For example, the gate insulation layer 115 may include hafnium oxide ($HfO_x$), aluminum oxide ($AlO_x$), zirconium oxide ($ZrO_x$), titanium oxide ($TiO_x$), tantalum oxide ($TaO_x$), etc. These may be used alone or in a combination thereof.

A gate electrode 120 may be formed on the gate insulation layer 115. The gate electrode 120 may be positioned on a portion of the gate insulation layer 115 under which the active pattern 110 is located. In example embodiments, after forming a first conductive layer (not illustrated) may be formed on the gate insulation layer 115, the first conductive layer may be patterned by a photolithography process or an etching process using an additional etching mask. Hence, the gate electrode 120 may be formed on the gate insulation layer 115. The first conductive layer may be obtained by a printing process, a sputtering process, a chemical vapor deposition process, a pulsed laser deposition (PLD) process, a vacuum evaporation process, an atomic layer deposition process, etc. The gate electrode 120 may be formed using metal, alloy, metal nitride, conductive metal oxide, a transparent conductive material, etc. For example, the gate electrode 120 may include aluminum (Al), alloy containing aluminum, aluminum nitride ($AlN_x$), silver (Ag), alloy containing silver, tungsten (W), tungsten nitride ($WN_x$), copper (Cu), alloy containing copper, nickel (Ni), chrome (Cr), chrome nitride ($CrN_x$), molybdenum (Mo), alloy containing molybdenum, titanium (Ti), titanium nitride ($TiN_x$), platinum (Pt), tantalum (Ta), tantalum nitride ($TaN_x$), neodymium (Nd), scandium (Sc), strontium ruthenium oxide (SRO), zinc oxide ($ZnO_x$), indium tin oxide (ITO), tin oxide ($SnO_x$), indium oxide ($InO_x$), gallium oxide ($GaO_x$), indium zinc oxide (IZO), etc. These may be used alone or in a combination thereof. Further, the gate electrode 120 may have a single layer structure or a multi layer structure, which may include a metal film, an alloy film, a metal nitride film, a conductive metal oxide film and/or a transparent conductive material film.

Although it is not illustrated in FIG. 5, a gate line may be formed on the gate insulation layer 115 while forming the gate electrode 120. The gate electrode 120 may be electrically connected to the gate line. The gate line may extend on the gate insulation layer 115 along a first direction.

Using the gate electrode 120 as an implantation mask, impurities may be dope into the active pattern 110 to form a source region 111 and a drain region 112 in the active pattern 110. Here, the impurities may not implanted into a central portion of the active pattern 115 under the gate electrode 120, and thus the central portion of the active pattern 115 may be a channel region 113 between the source region 111 and the drain region 112.

An insulating interlayer 125 may be formed on the gate insulation layer 115 to cover the gate electrode 120. The insulating interlayer 125 may be uniformly formed on the gate insulation layer 115 along a profile of the gate electrode 120. The insulating interlayer 125 may include a silicon compound. For example, the insulating interlayer 125 may be formed using silicon oxide, silicon nitride, silicon oxynitride, silicon oxycarbide, silicon carbon nitride, etc. These may be used alone or in a combination thereof. Further, the insulating interlayer 125 may be obtained by a spin coating process, a chemical vapor deposition process, a plasma enhanced chemical vapor deposition process, a high density plasma-chemical vapor deposition process, etc. The insulating interlayer 125 may electrically insulate the gate electrode 120 from a source electrode 130 and a drain electrode 135 successively formed.

As illustrated in FIG. 5, the source electrode 130 and the drain electrode 135 may pass through the insulating interlayer 125. The source and the drain electrodes 130 and 135 adjacent to the gate electrode 120 may be separated from each other centering the gate electrode 120. The source electrode 130 and the drain electrode 135 may make contact with the source region 111 and the drain region 112, respectively. In example embodiments, the insulating interlayer 125 may be partially etched to form holes exposing the source and the drain electrodes 130 and 135, and then a second conductive layer (not illustrated) may be formed on the exposed source and the exposed drain electrodes 130 and 135 to substantially fill the holes. The second conductive layer may be patterned to provide the source and the drain electrodes 130 and 135. In this case, the second conductive layer may be formed by a sputtering process, a chemical vapor deposition (CVD) process, a pulsed laser deposition (PLD) process, a vacuum evaporation process, an atomic layer deposition (ALD) process, a printing process, etc. Each of the source and the drain electrodes 130 and 135 may include metal, alloy, metal nitride, conductive metal oxide, a transparent conductive material, etc. For example, each of the source and the drain electrodes 130 and 135 may be formed using aluminum, alloy containing aluminum, aluminum nitride, silver, alloy containing silver, tungsten, tungsten nitride, copper, alloy containing copper, nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, gallium oxide, indium zinc oxide, etc. These may be used alone or in a combination thereof.

Although it is not illustrated in FIG. 5, a data line may be formed on the insulating interlayer 125 while forming the source and the drain electrodes 130 and 135. The data line may extend on the insulating interlayer 125 along a second direction substantially perpendicular to the first direction in which the gate line may extend. The date line may be electrically connected to the source electrode 130.

As the formations of the source and the drain electrodes 130 and 135 through the insulation layer 125, a thin film transistor (TFT) may be provided on the first substrate 100 as a switching device. Here, the thin film transistor may include the active pattern 110, the gate insulation layer 115, the gate electrode 120, the source electrode 130 and the drain electrode 135.

An insulation layer 140 may be formed on the insulating interlayer 125 to cover the source and the drain electrodes 130 and 135. The insulation layer 140 may have a thickness to sufficiently cover the source and the drain electrodes 130 and 135. The insulation layer 140 may be formed using an organic material or an inorganic material. For example, the insulation layer 140 may include photoresist, acryl-based resin, polyimide-based resin, polyamide-based resin, siloxane-based resin, resin containing photosensitive acrylic carboxyl group, novolak resin, alkali-soluble resin, silicon oxide, silicon nitride, silicon oxynitride, silicon oxycarbide, silicon carbon nitride, etc. These may be used alone or in a combination thereof. According to a material included in the insulation layer 140, the insulation layer 140 may be formed by a spin coating process, a printing process, a sputtering process, a chemical vapor deposition process, an atomic layer deposition process, a plasma enhanced chemical vapor deposition process, a high density plasma-chemical vapor deposition process, a vacuum evaporation process, etc.

By a photolithography process or an etching process using an additional etching mask, the insulation layer 140 may be partially etched to form a contact hole that may a portion of the drain electrode 135 of the switching device. A first electrode 145 may be formed on insulation layer 140 to substantially fill the contact hole. Thus, the first electrode 145 may make contact with the exposed portion of the drain electrode 135. In some example embodiments, a contact (not illustrated), a plug (not illustrated) or a pad (not illustrated) may be formed on the drain electrode 135 to fill the contact hole, and then the first electrode 145 may be provided on the insulation layer 140 to be connected to the contact, the plug or the pad. Here, the first electrode 145 may be electrically connected to the drain electrode through the contact, the plug or the pad.

When the organic light emitting structure has a top emission type, the first electrode 145 may be formed using metal having reflectivity, alloy having reflectivity, etc. For example, the first electrode 145 may include aluminum, silver, platinum, gold (Au), chrome, tungsten, molybdenum, titanium, palladium (Pd), iridium (Ir), alloys thereof, etc. These may be used alone or in a combination thereof. Further, the first electrode 145 may be obtained by a printing process, a sputtering process, a chemical vapor deposition process, an atomic layer deposition process, a pulsed laser deposition process, a vacuum evaporation process, etc.

A pixel defining layer 150 may be formed on the first electrode 145. The pixel defining layer 150 may be obtained using an organic material or an inorganic material. For example, the pixel defining layer 150 may include photoresist, polyacryl-based resin, polyimide-based resin, acryl-based resin, a silicon compound, etc. Additionally, the pixel defining layer 150 may be formed on the first electrode 145 by a spin coating process, a spraying process, a printing process, a chemical vapor deposition process, etc.

The pixel defining layer 150 may be partially etched to form an opening that exposes a portion of the first electrode 145. The opening of the pixel defining layer 150 may define the display region and a non-display region of the organic light emitting display device. For example, a portion of the organic light emitting display device may be the display region where the opening of the pixel defining layer 150 is located.

Figure 6:
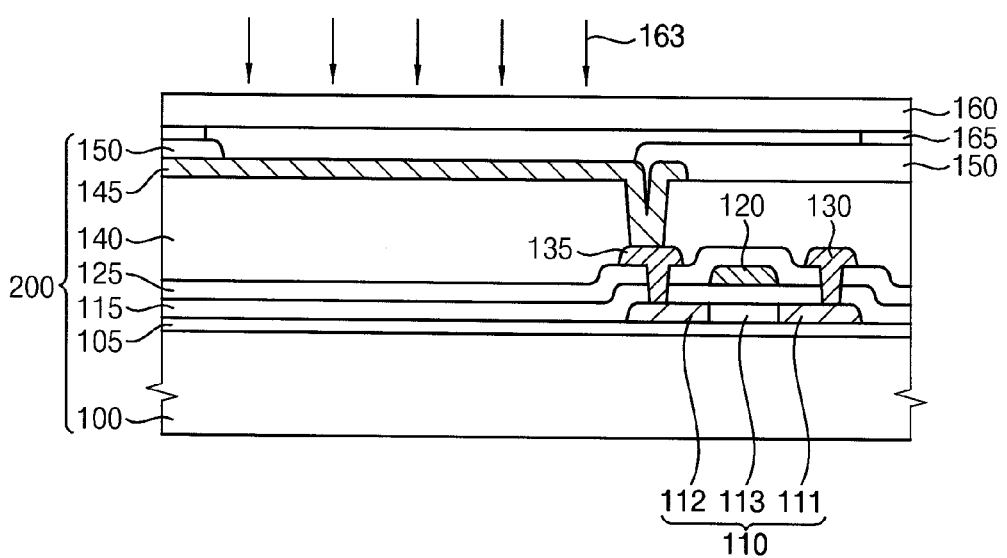

Referring to FIG. 6, the donor substrate 160 having a tightening member 165 may be attached to a display substrate 200. As described above, the tightening member 165 having an adhesive film may have various shapes a substantially rectangular ring shape, a substantially rectangular frame shape, a substantially circular ring shape, a substantially elliptical ring shape or a substantially polygonal ring shape in accordance with the shape of the display substrate 200. The tightening member 165 may be attached to a peripheral portion of the display substrate 200.

In example embodiments, the display substrate 200 may be placed on a supporting member (not illustrated) such as a chuck or a plate, and then the donor substrate 160 may be aligned with respect to the display substrate 200 under a vacuum condition while corresponding an organic transfer layer of the donor substrate 160 to the display region of the display substrate 200. Hence, an air may not remain between the first electrode 145 of the display substrate 200 and the organic transfer layer of the donor substrate 160. Then, the donor substrate 160 having the tightening member 165 may be combined with the display substrate 200 by pressing the donor substrate 160 using a pressurizing member (not illustrated).

As shown in FIG. 6 using arrows, a laser beam 163 may be irradiated onto the donor substrate 160 from a light source (not illustrated), so that the organic transfer layer of the donor substrate 160 may be transferred onto the exposed portion of the first electrode 145 of the display substrate 200. In this case, the laser beam 163 may be irradiated onto a portion of the donor substrate 160 corresponding to the display region of the display substrate 200 having the exposed first electrode 145. For example, the light source may include a laser source, a xenon (Xe) lamp, a flash lamp, etc.

When the laser beam 163 is irradiated onto a portion of the donor substrate 160, an adhesion strength between the organic transfer layer and the display substrate 200 may be substantially larger than an adhesion strength between the buffer layer and the organic transfer layer. Therefore, the organic transfer layer may be partially detached from the buffer layer to thereby form an organic light emitting structure 170 (see FIG. 7) may be formed on the display region of the display substrate 200.

Figure 7:
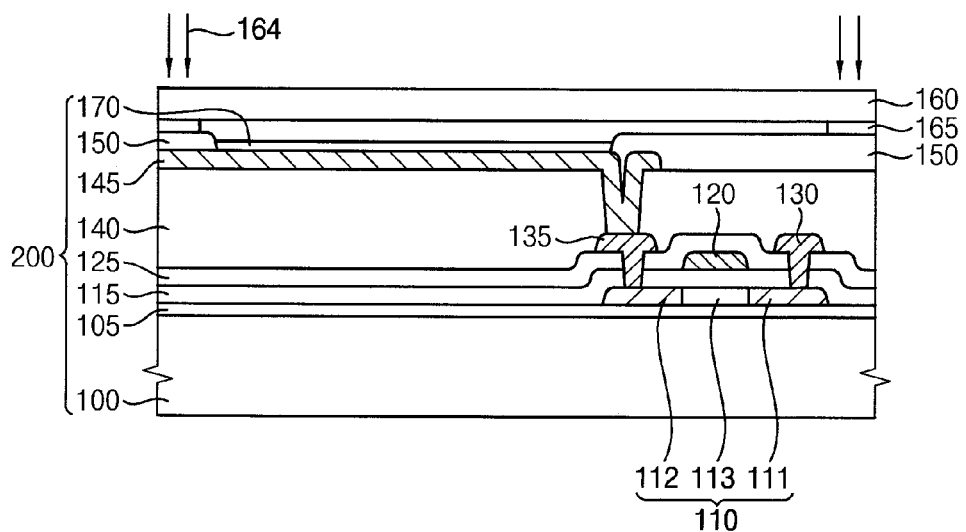

Referring to FIG. 7, the organic light emitting structure 170 may be formed on the exposed first electrode 145 by the above-described laser induced thermal imaging process. Here, the organic light emitting structure 170 may have a multi layer structure which may include an organic light emitting layer (EL), a hole injection layer (HIL), a hole transfer layer (HTL), an electron transfer layer (ETL), etc. Additionally, the organic light emitting layer of the organic light emitting structure 170 may include different light emitting materials for generating a red color of light, a blue color of light and a green color of light. In some example embodiments, the organic light emitting layer may have a stacked structure including a plurality of different light emitting materials for generating a white color of light.

According to example embodiments of the invention, the donor substrate 160 having the tightening member 165 may be attached to the display substrate 200 under a vacuum condition, such that an air may not be trapped between the display substrate 200 and the donor substrate 160. Thus, a substantial vacuum state between the display substrate 200 and the donor substrate 160 may be maintained while forming the organic light emitting structure 170 from the organic transfer layer. As a result, the uniformity of the organic light emitting structure 170 may be improved uniformity and also the deterioration and the damage of the organic light emitting structure 170 may be prevented.

Referring now to FIG. 7, the donor substrate 160 may be separated from the display substrate 200 by irradiated the ultraviolet ray 164 onto the tightening member 165 as indicated using arrows. In example embodiments, the ultraviolet ray 164 may be selectively irradiated onto the tightening member 165 along the peripheral portion of the donor substrate 160, so that the adhesion strength of the tightening member 165 including the adhesive film may be decreased. Hence, the donor substrate 160 having the tightening member 165 may be easily detached from the display substrate 200 after the formation of the organic light emitting structure 170. In this case, the organic light emitting structure 170 may not be damaged while separating the donor substrate 160 from the display substrate 200 because the donor substrate 160 may be removed from the display substrate 200 in accordance with the decrease of the adhesion strength of the tightening member 165. Additionally, failures caused by impurities, particles or bubbles may be prevented in successive manufacturing processes because no impurities, particles or bubbles may remain on the organic light emitting structure 170 and the pixel defining layer 150.

Figure 8:
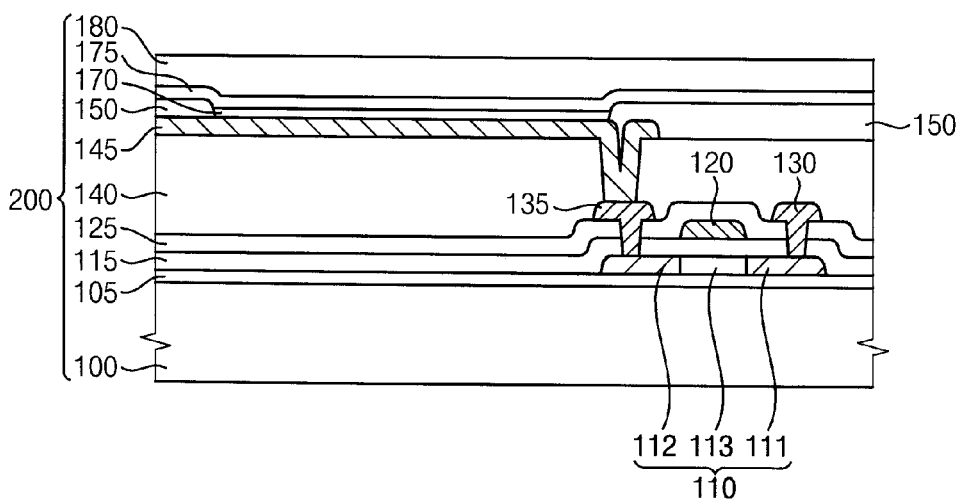

Referring to FIG. 8, a second electrode 175 may be formed on the organic light emitting structure 170 and the pixel defining layer 150. When the organic light emitting display device may have a top emission type, the second electrode 175 may be formed using a transparent conductive material, for example, indium tin oxide, tin oxide, indium zinc oxide, zinc oxide, indium gallium oxide, gallium oxide, etc. These may be used alone or in a combination thereof. Further, the second electrode 175 may be formed by a sputtering process, a chemical vapor deposition process, an atomic layer deposition process, a pulsed laser deposition process, a printing process, etc.

A second substrate 180 may be disposed on the second electrode 175. The second substrate 180 may include a transparent insulation substrate. For example, the second substrate 180 may include a glass substrate, a quartz substrate, a transparent resin substrate, etc. In example embodiments, a predetermined space may be provided between the second electrode 175 and the second substrate 180. This space between the second electrode 175 and the second substrate 180 may be filled with an air or an inactive gas such as a nitrogen ($N_2$) gas. In some example embodiments, a protection layer (not illustrated) may be additionally formed between the second electrode 175 and the second substrate 180. Here, the protection layer may include photoresist, acryl-based resin, polyimide-based resin, polyamide-based resin, siloxane-based resin, etc.

According to example embodiments of the invention, a donor substrate may include a tightening member which may have a relatively large adhesion strength before an ultraviolet ray is irradiated thereto whereas may have a relatively small adhesion strength after the ultraviolet ray is irradiated thereto. The donor substrate may be combined with a display substrate while the tightening member is interposed between the donor substrate and the display substrate. An air may not be trapped or remained between the donor substrate and the display substrate, so that a substantial vacuum state may be maintained between the donor and the display substrates in a laser induced thermal imaging process. Thus, an organic light emitting structure may be uniformly formed on the display substrate from an organic transfer layer of the donor substrate without any damage or deterioration of the organic light emitting structure. Additionally, an ultraviolet ray may be selectively irradiated onto the tightening member along a peripheral portion of the donor substrate to considerably reduce the adhesion strength of the tightening member, such that particles, impurities and/or bubbles may not remain on the organic light emitting structure or a pixel defining layer of the display substrate after separating the donor substrate from the display substrate. As a result, an organic light emitting display device may ensure improved performances while reducing failures caused by the particles, the impurities and/or the bubbles in manufacturing processes.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The invention is defined by the following claims, with equivalents of the claims to be included therein.

What is claimed is:

1. A method of manufacturing an organic light emitting display device, the method comprising:
    forming a display substrate including a switching device, a first electrode and a pixel defining layer;
    forming a donor substrate including a base layer, a light to heat conversion layer formed on the base layer, an organic transfer layer formed on the light to heat conversion layer, and a tightening member having an adhesive film and disposed on a peripheral portion of the organic transfer layer, an adhesion strength of the adhesive film being changed when exposed to an ultraviolet (UV) ray;
    combining the donor substrate with the display substrate with the tightening member interposed between the donor and the display substrates;
    irradiating the donor substrate with a laser beam to form an organic light emitting structure on the first electrode in a display region of the display substrate from the organic transfer layer of the donor substrate;
    irradiating the tightening member with a ultraviolet ray; and
    separating the donor substrate from the display substrate.

2. The method of claim 1, wherein the tightening member has a rectangular ring shape, a rectangular frame shape, a circular ring shape, an elliptical ring shape or a polygonal ring shape.

3. The method of claim 2, wherein the tightening member has an outer horizontal width and an outer longitudinal width same as a horizontal width and a longitudinal width of the display substrate, respectively.

4. The method of claim 3, wherein both surfaces of the adhesive film of the tightening member have adhesion strengths.

5. The method of claim 2, wherein the tightening member has an inner horizontal width and an inner longitudinal width same as a horizontal width and a longitudinal width of the display substrate, respectively.

6. The method of claim 5, wherein one surface of the adhesive film of the tightening member has an adhesion strength, and an inner surface of the adhesive film contacting the display substrate has an adhesion strength.

7. The method of claim 1, wherein separating the donor substrate from the display substrate includes selectively irradiating the tightening member with an ultraviolet ray.

* * * * *